United States Patent [19]
Veytsman et al.

[11] Patent Number: 5,969,539
[45] Date of Patent: Oct. 19, 1999

[54] PRODUCT TERM EXPORTING MECHANISM AND METHOD IMPROVEMENT IN AN EPLD HAVING HIGH SPEED PRODUCT TERM ALLOCATION STRUCTURE

[75] Inventors: Isaak Veytsman, Santa Clara; Jeffrey H. Seltzer, Los Gatos; Hua Xue, Sunnyvale, all of Calif.

[73] Assignee: Xilinx, Inc., San Jose, Calif.

[21] Appl. No.: 08/946,672

[22] Filed: Oct. 7, 1997

Related U.S. Application Data

[63] Continuation-in-part of application No. 08/726,115, Oct. 4, 1996, Pat. No. 5,821,774, which is a continuation-in-part of application No. 08/452,448, May 26, 1995, Pat. No. 5,563,529.

[51] Int. Cl.$^6$ .................................................. H03K 19/177
[52] U.S. Cl. ............................................... 326/39; 326/40
[58] Field of Search .......................................... 326/39, 40

[56] References Cited

U.S. PATENT DOCUMENTS

| | | | |
|---|---|---|---|
| 4,758,746 | 7/1988 | Birkner et al. | 307/465 |
| 4,912,345 | 3/1990 | Steele et al. | 307/465 |
| 4,933,577 | 6/1990 | Wong et al. | 307/465 |
| 5,027,011 | 6/1991 | Steele | 307/465 |
| 5,027,315 | 6/1991 | Agrawal et al. | 364/900 |
| 5,121,006 | 6/1992 | Pedersen | 307/465 |
| 5,136,188 | 8/1992 | Ha et al. | 307/465 |
| 5,260,611 | 11/1993 | Cliff et al. | 307/465 |
| 5,309,046 | 5/1994 | Steele | 307/465 |
| 5,350,954 | 9/1994 | Patel | 326/39 |
| 5,357,153 | 10/1994 | Chiang et al. | 326/39 |
| 5,359,242 | 10/1994 | Veenstra | 326/39 |
| 5,450,608 | 9/1995 | Steele | 326/39 |
| 5,565,792 | 10/1996 | Chiang et al. | 326/39 |
| 5,821,774 | 10/1998 | Veytsman et al. | 326/39 |

*Primary Examiner*—David Mis
*Attorney, Agent, or Firm*—Crosby, Heafey, Roach & May; Jeanette S. Harms

[57] ABSTRACT

An EPLD having improved routing and arithmetic function implementation characteristics. Cascade and carry logic in macrocells allows for simultaneous product term exporting to both previous and subsequent macrocells.

19 Claims, 18 Drawing Sheets

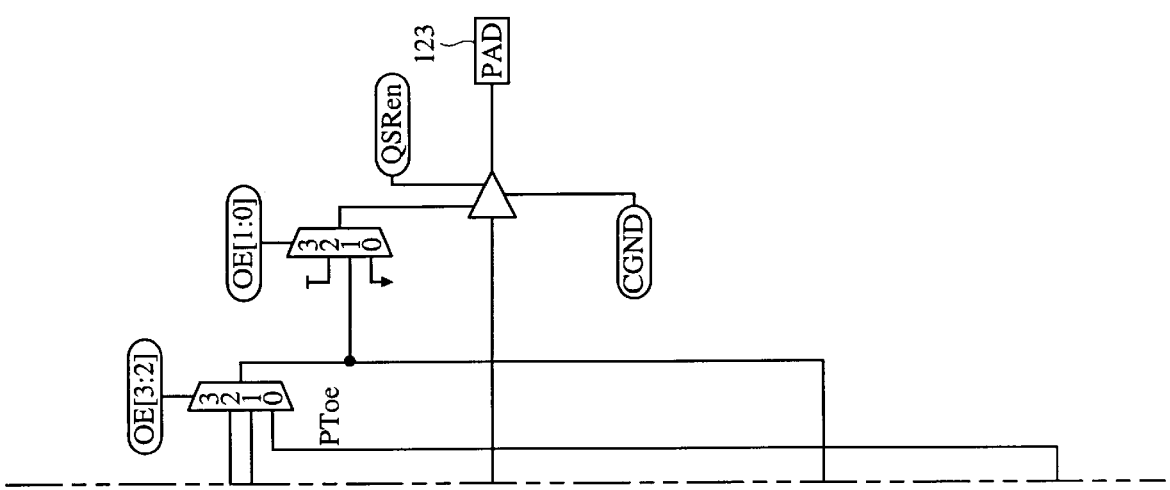

PRODUCT TERM EXPORTING MECHANISM AND METHOD IMPROVEMENT IN AN EPLD HAVING HIGH SPEED PRODUCT TERM ALLOCATION STRUCTURE

CROSS-REFERENCE TO RELATED APPLICATIONS

This application is a continuation-in-part of U.S. patent application Ser. No. 08/726,115, now U.S. Pat. No. 5,821,774, entitled STRUCTURE AND METHOD FOR ARITHMETIC FUNCTION IMPLEMENTATION IN AN EPLD HAVING HIGH SPEED PRODUCT TERM ALLOCATION STRUCTURE to Veytsman, et al., filed Oct. 4, 1996, which is a continuation-in-part of Ser. No. 08/452,448, filed on May 26, 1995, now U.S. Pat. No. 5,563,526 issued on Oct. 8, 1996.

FIELD OF THE INVENTION

This invention relates generally to custom programmable integrated circuit logic devices, and more particularly to an improved Programmable Array Logic-based erasable-programmable logic device (EPLD) including an improved arithmetic function architecture.

BACKGROUND OF THE INVENTION

In response to the increasing need for flexibility and speed in integrated circuit (IC) design, a class of IC's known as erasable programmable logic devices (EPLDs) was developed. EPLDs enable the designer to custom program arbitrary logical functions in an IC chip, according relative ease and flexibility in testing prototypes and making design changes.

FIG. 1 illustrates one EPLD architecture which includes an array of function blocks 1, 2, 3, 4 interconnected via a universal interconnect matrix (UIM) 5. For simplicity, only one function block is shown in detail. The input lines 6 into function block 1 are programmably combined into a number of AND gates 7 in an AND array 8. The output lines 9 from AND array 8 are called product terms (or bit lines). Product terms 9 of AND gates 7 are provided to one of a plurality of macrocells (MC) 10 in each function block.

The architecture of a typical macrocell 10 is shown in FIG. 2. Macrocell 10 configures the outputs of AND array 8 of FIG. 1 and may perform additional logic on the output signals of AND array 8. Macrocell 10 contains an OR gate 11 into which product terms are gated, and a register (flip flop) 12 for storing the output signal of OR gate 11. The signals on output line 13 of OR gate 11 and output lines 13a and 13b of register 12 are programmably routed by setting the multiplexers (MUXs) 14, 15 and 16 with configuration bits on their control terminals, each specifying the output state of the respective MUX.

Macrocell 10 advantageously provides a relatively large number of product terms 11.1 per macrocell. However, a fixed product term count is not flexible enough to handle the product term count variability that arises during use of the macrocell. Specifically, user product term requirements for a logic function typically vary widely, anywhere from one to sixteen product terms or more, depending on the complexity of the logic function. In fact, single product term functions are quite common. For logic functions requiring less than eight product terms in macrocell 10, for example, the unused product terms are wasted. For functions requiring more than eight product terms, the function must be split up into two or more subfunctions, each of which can be implemented with the available eight product terms of a macrocell. The results of the subfunction operations must make additional passes through the UIM to be recombined in other macrocells, thus incurring a significant time delay in the execution of complex logic functions.

To address the need for a flexible macrocell architecture, more recent EPLDs feature macrocells with the ability to direct their OR gate output signals directly into adjacent macrocell OR gates, without passing through the interconnect matrix, a feature known as cascading. Cascading enables product terms associated with more than one macrocell to be implemented rapidly, without incurring the delay normally associated with routing signals through the interconnect matrix. This process is known as product term expansion.

Product term expansion is particularly useful during the design of complex integrated circuitry. A serious problem introduced by PLD architectures is that, after device output pin locations are committed (as on a printed circuit board), further alterations of the application logic implemented within the PLD often cannot be accomplished without relocating some of the output pins. The problem of relocation is more prevalent when logic functions have already been formed using product term cascading. Relocation of the output pins results in design delay and expense.

Certain prior art devices provide for the reallocation of product terms by allowing a first cluster of macrocell product terms (e.g., 3 or 4) to be shifted to a first neighboring macrocell and allowing a second cluster of macrocell product terms to be shifted to a second neighboring macrocell. Either all or none of the product terms in the cluster are reallocated. Moreover, each cluster cannot be reallocated beyond its associated neighboring macrocell.

Other prior art devices provide for the reallocation of product terms by providing a path between a series of macrocells. Fixed blocks of four product terms are propagated in a predetermined direction along this path to any one of the macrocells. Yet other devices incorporate macrocells which allow product term expansion without additional passes through macrocell logic. Such macrocells work by "stealing" all the product terms of one or both of its neighboring macrocells, for a total of up to 16 product terms. These macrocells can only "steal" product terms from its immediate neighbors, thereby limiting the flexibility of the macrocells. Moreover, these macrocells are also limited to 16 product terms, and the register within a macrocell whose product terms are stolen is thereby rendered useless.

FIG. 3 shows a macrocell 17 disclosed in Pedersen U.S. Pat. No. 5,121,006. In macrocell 17, cascading is accomplished by setting the configuration bit of MUX 18 to logic 1, thereby directing the signal on output line 19 of OR gate 20 into OR gate 21 of an adjacent macrocell 22. By cascading a series of macrocells in this way, a selectable number of product terms are gated together. For example, OR gate 33 from adjacent macrocell 34 is shown cascaded into OR gate 20 of macrocell 17. The cascading described in Pedersen is unidirectional. If not all of the product terms in macrocell 17 are provided to adjacent macrocell 22, the unused product terms can be routed to the input of exclusive OR gate 36 or to the secondary inputs of register 32. This routing is performed by means of switches 23, 24, 25, 26, 27 and the MUXs 28, 29, 30, 31. The circuit of Pedersen undesirably increases complexity and thus compromises speed. Additionally, macrocell 17 does not provide means for performing an OR operation on the unused product terms.

Other patents which discuss the reallocation of product terms include: U.S. Pat. Nos. 4,758,746 (Birkner et al.); 4,912,345 (Steele et al.); 4,933,577 (Wong et al.); 5,027,011 (Steele); 5,027,315 (Agrawal et al.); 5,136,188 (Ha et al.); 5,260,611 (Cliff et al.) and 5,309,046 (Steele).

Therefore, a need arises for a high speed product term allocation structure that supports the flexible reallocation of product terms among macrocells, even after the device pins have been committed. In particular, a need arises for a product term allocation structure which allows (1) routing of product terms in a bidirectional manner between macrocells, (2) routing of product terms through a plurality of macrocells, (3) routing a variable, selectable number of product terms without a loss of capacity in the macrocell from which the product term is routed, and (4) importing product terms to perform a large function within a local macrocell, while simultaneously exporting product terms from the local macrocell to another macrocell, to maintain the committed pinout during the design phase. None of the above-mentioned documents, nor any combination of the above-mentioned documents, disclose a device which provides these desired advantages.

There is a further need to obtain all of the above described advantages without the concurrent disadvantages of timing, density and pin locking as will be described in greater detail hereinafter.

SUMMARY OF THE INVENTION

A macrocell in accordance with one embodiment of the present invention includes a first macrocell which connects between logic forming circuitry of a programmable logic device and an output terminal of the programmable logic device and includes an export logic gate, a first cascade control circuit connected to receive logic signals from a second macrocell, a local logic gate coupled between the first cascade control circuit and the output terminal of the programmable logic device, a second cascade control circuit connected to an output terminal of the export logic gate and an output terminal of the local logic gate, and a third cascade control circuit connected to receive logic signals from the third macrocell. The first cascade control circuit is programmable to route logic signals received from the second macrocell to the export logic gate. The second cascade control circuit is programmable to route logic signals output by either the export logic gate or the local logic gate to a third macrocell. The third cascade control circuit is programmable to route logic signals received from the third macrocell to either the export logic gate or the output terminal of the programmable logic device.

In the preferred embodiment, the first cascade control circuit is further programmable to route the logic signals received from the second macrocell to the output terminal of the programmable logic device. The export logic gate and the local logic gate can each comprise an OR gate.

The preferred embodiment further includes one or more input lines which are connected to receive a corresponding number of logic signals from the logic forming circuitry, and one or more programmable distribution circuits. Each distribution circuit is connected to one of the input lines and each distribution circuit is independently programmable to route a received logic signal to either the export logic gate or the local logic gate.

A macrocell according to a second embodiment of the invention connects between logic forming circuitry of a programmable logic device and an output terminal of the programmable logic device and includes one or more input lines which receive a corresponding one or more logic signals, a local logic gate, an export logic gate, and one or more distribution circuits. Each distribution circuit is connected to a corresponding one of the input lines and is independently programmable to route a corresponding logic signal to either the local logic gate or the export logic gate. Also included are a first cascade control circuit connected to both an output terminal of the export logic gate and an output of the local logic gate, a second cascade control circuit connected to receive logic signals from the second macrocell, and a third cascade control circuit connected to receive logic signals from the third macrocell.

The first cascade control circuit of the second embodiment is programmable to route logic signals output by the export logic gate and/or the local logic gate to a second macrocell and a third macrocell. The second cascade control circuit is programmable to route logic signals received from the second macrocell to an input of either the export logic gate or the local logic gate. The third cascade control circuit is programmable to route logic signals received from the third macrocell to an input of either the export logic gate or the local logic gate.

A method of routing logic signals from logic forming circuitry of a programmable logic device to output terminals of the programmable logic device according to the invention includes the steps of providing a plurality of first logic signals to a first macrocell of the programmable logic device, selecting first and second groups of the first logic signals, wherein the number of first logic signals in the first and second groups can be varied, transmitting the first group of the first logic signals to an output terminal corresponding to the first macrocell, transmitting either the first group of the first logic signals or the second group of the first logic signals to a second macrocell of the programmable logic device, providing a plurality of second logic signals from a third macrocell to the first macrocell, and selectively transmitting the second logic signals to the output terminal of the first macrocell or to the second macrocell, wherein the first group of the first logic signals includes any number from zero to all of the first logic signals. Preferably, the second macrocell is located adjacent to the first macrocell.

Preferably also included is the step of transmitting a third group of logic signals from the second macrocell to the output terminal corresponding to the first macrocell, wherein the third group includes one or more logic signals provided to the second macrocell.

An alternative method according to the invention of routing logic signals from logic forming circuitry of a programmable logic device to output terminals of the programmable logic device includes the steps of providing a plurality of logic signals to a first macrocell of the programmable logic device, selecting a first group of the logic signals and a second group of the logic signals, wherein the number of logic signals in the first group and the second group can be varied, transmitting the first group to an output terminal corresponding to the first macrocell, and transmitting either the first group or the second group to a second macrocell of the programmable logic device through one or more intermediate macrocells of the programmable logic device. The step of transmitting the second group can further include the step of selecting a direction of transmission. Other included steps can be transmitting a third group of logic signals from a third macrocell to the second macrocell and performing one or more logic functions on the second and third groups.

According to a third embodiment of the invention, a first macrocell which connects between logic forming circuitry of a programmable logic device and an output terminal of the programmable logic device includes one or more input lines which are connected to receive a corresponding number of logic signals from the logic forming circuitry, a first cascade control circuit for receiving a plurality of logic signals and being programmable to a first state in which the received plurality of logic signals are routed to a second macrocell or a second state in which the received plurality of logic signals are routed to a third macrocell, and one or more distribution circuits, each distribution circuit being coupled to one of the input lines. Each distribution circuit is independently programmable to a first state or a second state, wherein a distribution circuit programmed in the first state routes a first set of received logic signals to the output terminal of the programmable logic device and simultaneously to the first cascade control circuit, and wherein a distribution circuit programmed in the second state routes a second group of received logic signals only to the first cascade control circuit. Also included is a second cascade control circuit having an input terminal coupled to a third macrocell, the second cascade control circuit being programmable to a first state in which output signals from the third macrocell are routed to the output terminal of the programmable logic device or a second state in which the output signals from the third macrocell are routed to the first cascade control circuit.

The third embodiment preferably includes a local logic gate having an input terminal connected to the one or more distribution circuits and an output terminal connected to the output terminal of the programmable logic device. The first cascade control circuit includes a programmable latch having an output terminal; an export logic gate connected to the one or more distribution circuits; a first multiplexer having a control terminal coupled to the output terminal of the programmable latch, a first input terminal and a fourth input terminal coupled to an output terminal of the export logic gate, a second input terminal coupled to a reference voltage, a third input terminal coupled to the output terminal of the local logic gate, and an output terminal coupled to the second macrocell; and a second multiplexer having a control terminal coupled to the output terminal of the programmable latch, a first input terminal coupled to the reference voltage, a second input terminal and a third input terminal coupled to the output terminal of the export logic gate, a fourth input terminal coupled to the output terminal of the local logic gate, and an output terminal coupled to the third macrocell.

Also preferably included in the third embodiment is a third cascade control circuit having an input terminal connected to a second macrocell, whereby the third cascade control circuit can receive logic signals from the second macrocell. The third cascade control circuit is programmable to a first state, wherein in the first state the third cascade control circuit routes the received logic signals from the second macrocell to the output terminal of the programmable logic device or a second state in which the received logic signals from the second macrocell are routed to the first cascade control circuit.

According to a fourth embodiment of the invention, a first macrocell which connects between logic forming circuitry of a programmable logic device and an output terminal of the programmable logic device includes a first cascade control circuit for receiving a plurality of logic signals and routing the plurality of logic signals to a second macrocell, one or more input lines which are connected to receive a corresponding number of logic signals from the logic forming circuitry, and one or more distribution circuits. Each distribution circuit is coupled to one of the input lines, wherein each distribution circuit is independently programmable to a first state or a second state. A distribution circuit programmed in the first state routes a first set of received logic signals to the output terminal of the programmable logic device and simultaneously to the first cascade control circuit. A distribution circuit programmed in the second state routes a second group of received logic signals only to the first cascade control circuit.

A second cascade control circuit has an input terminal coupled to a third macrocell and is programmable to a first state in which output signals from the third macrocell are routed to the output terminal of the programmable logic device or a second state in which the output signals from the third macrocell are routed to the first cascade control circuit. A third cascade control circuit can be included for receiving a plurality of logic signals and routing the plurality of logic signals to the third macrocell.

The present invention will be more fully understood in light of the following detailed description taken together with the drawings.

BRIEF DESCRIPTION OF THE DRAWINGS

FIGS. 14A-B are a schematic diagram of a first embodiment of the improved macrocell of the present invention.

DETAILED DESCRIPTION OF THE DRAWINGS

Figure 1:
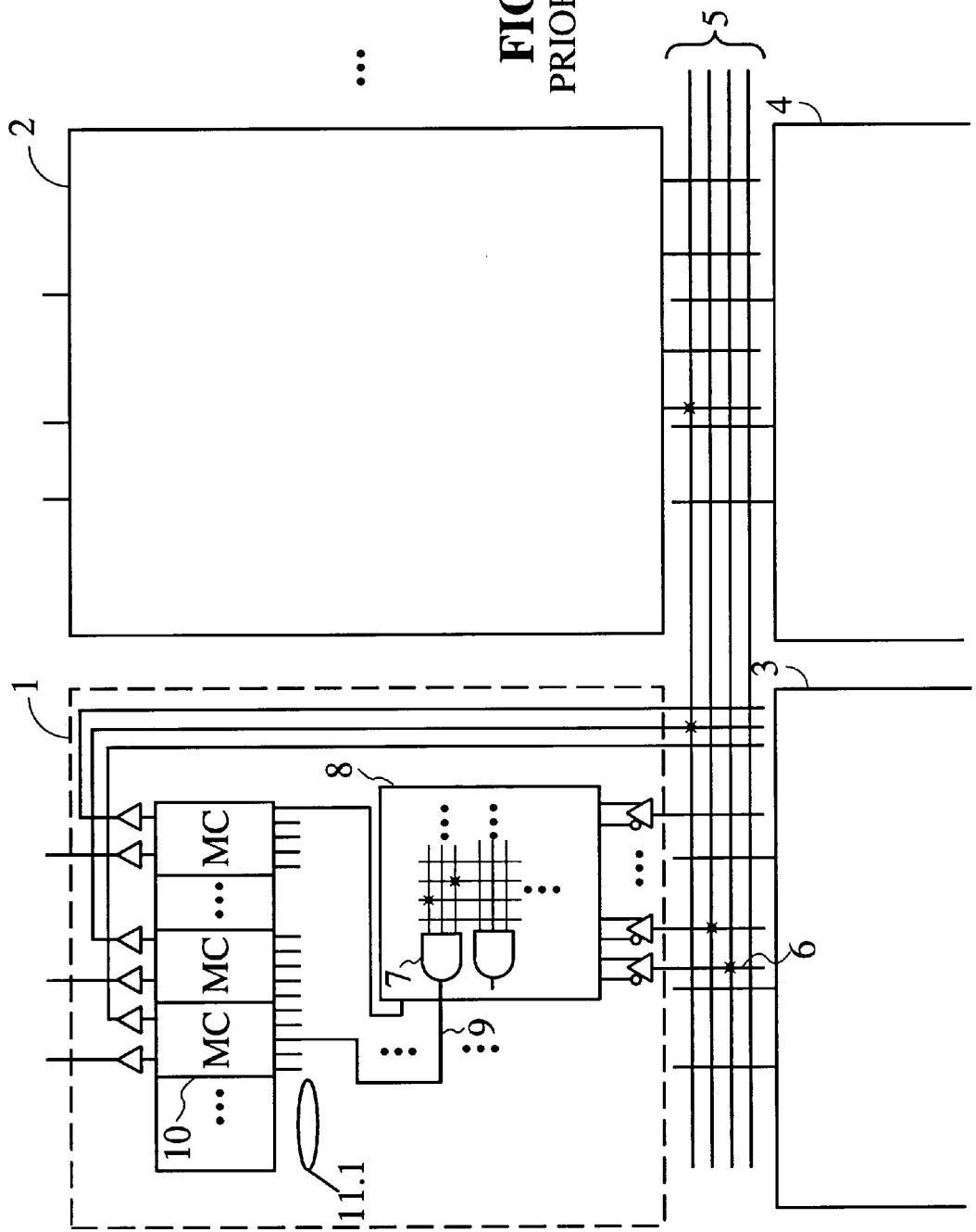
FIG. 1 is a block diagram of prior art PLD architecture.
Figure 2:
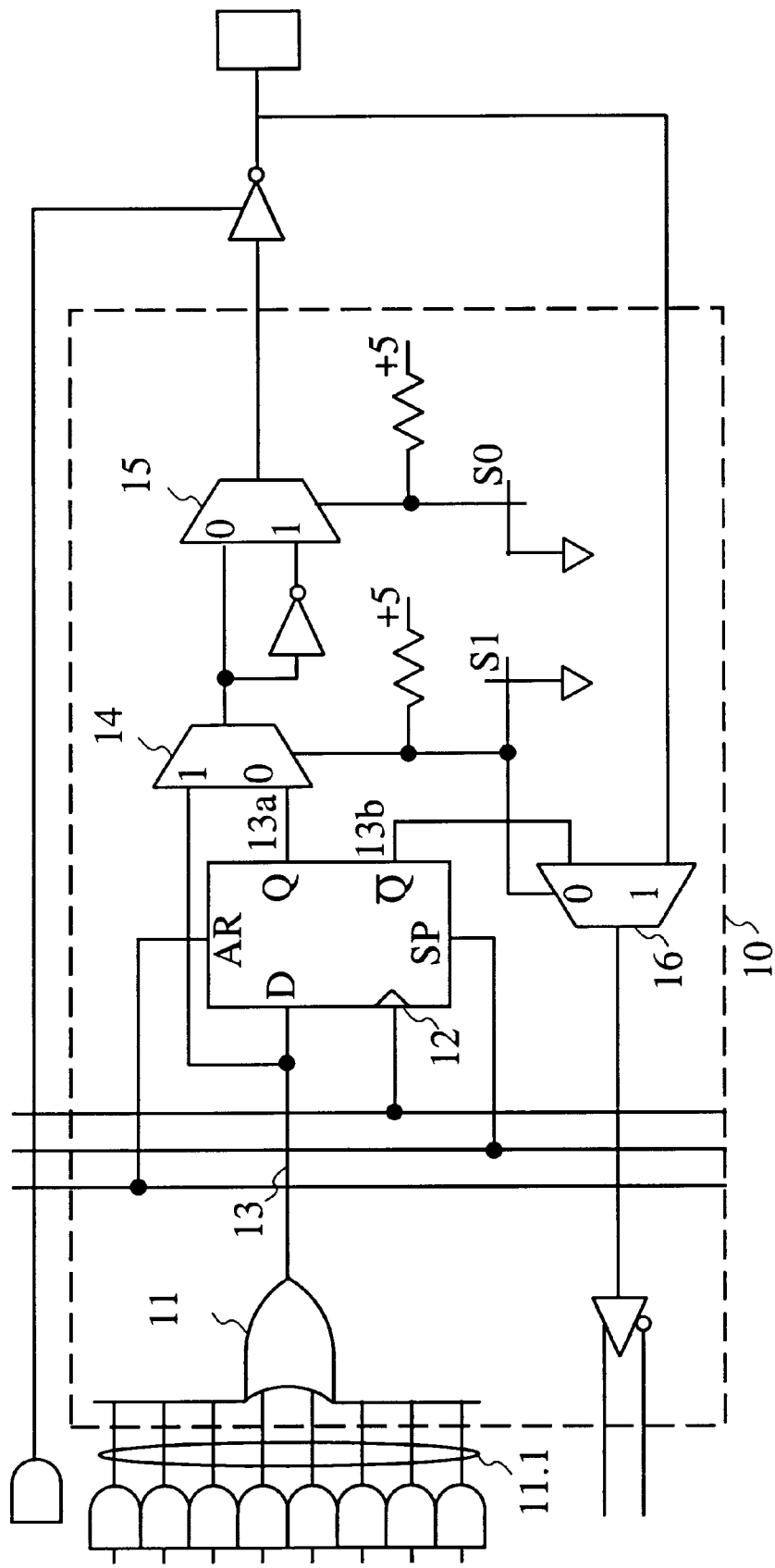
FIG. 2 is a schematic diagram of a prior art macrocell circuit.
Figure 3:
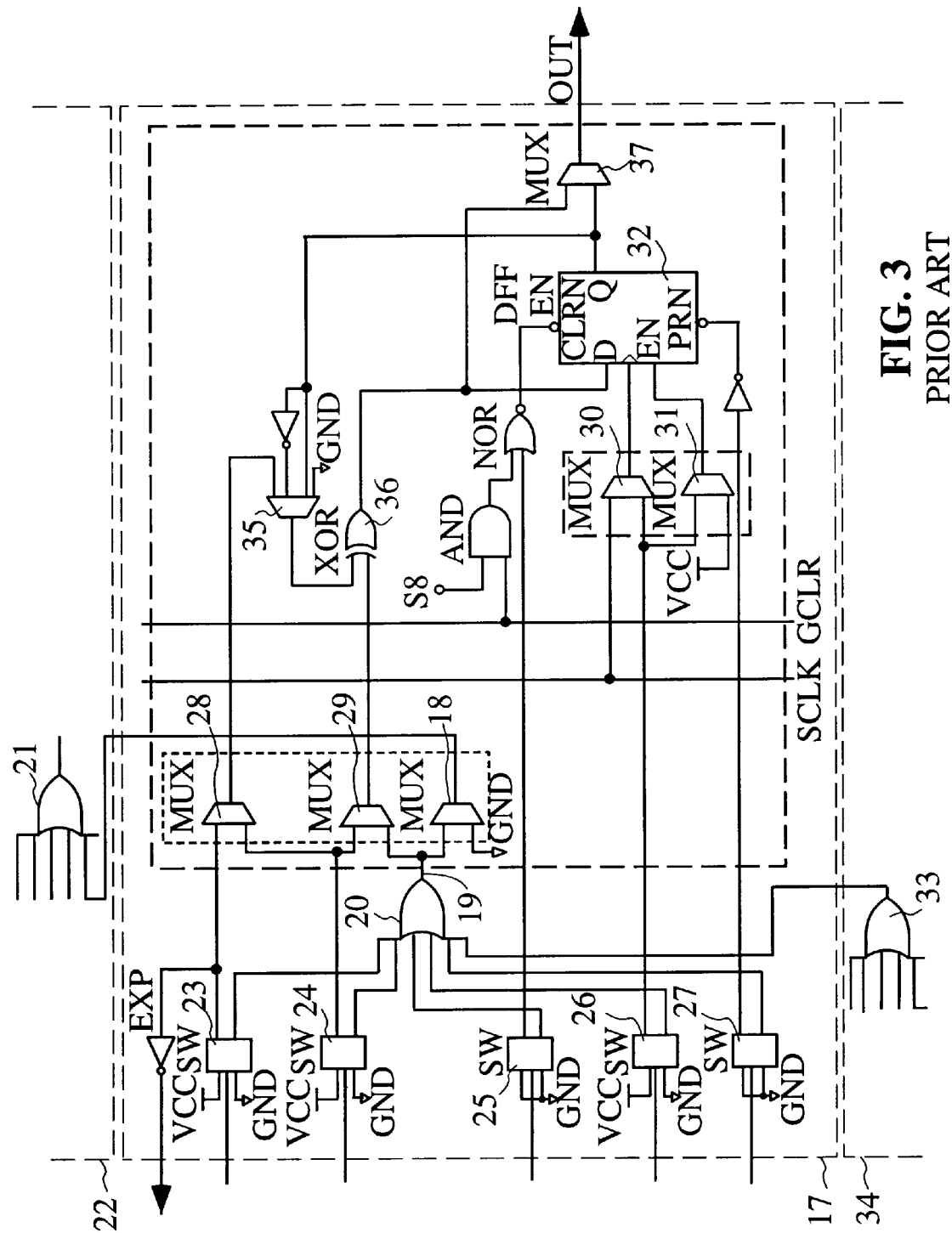
FIG. 3 is a schematic diagram of another prior art macrocell circuit.
Figure 4:
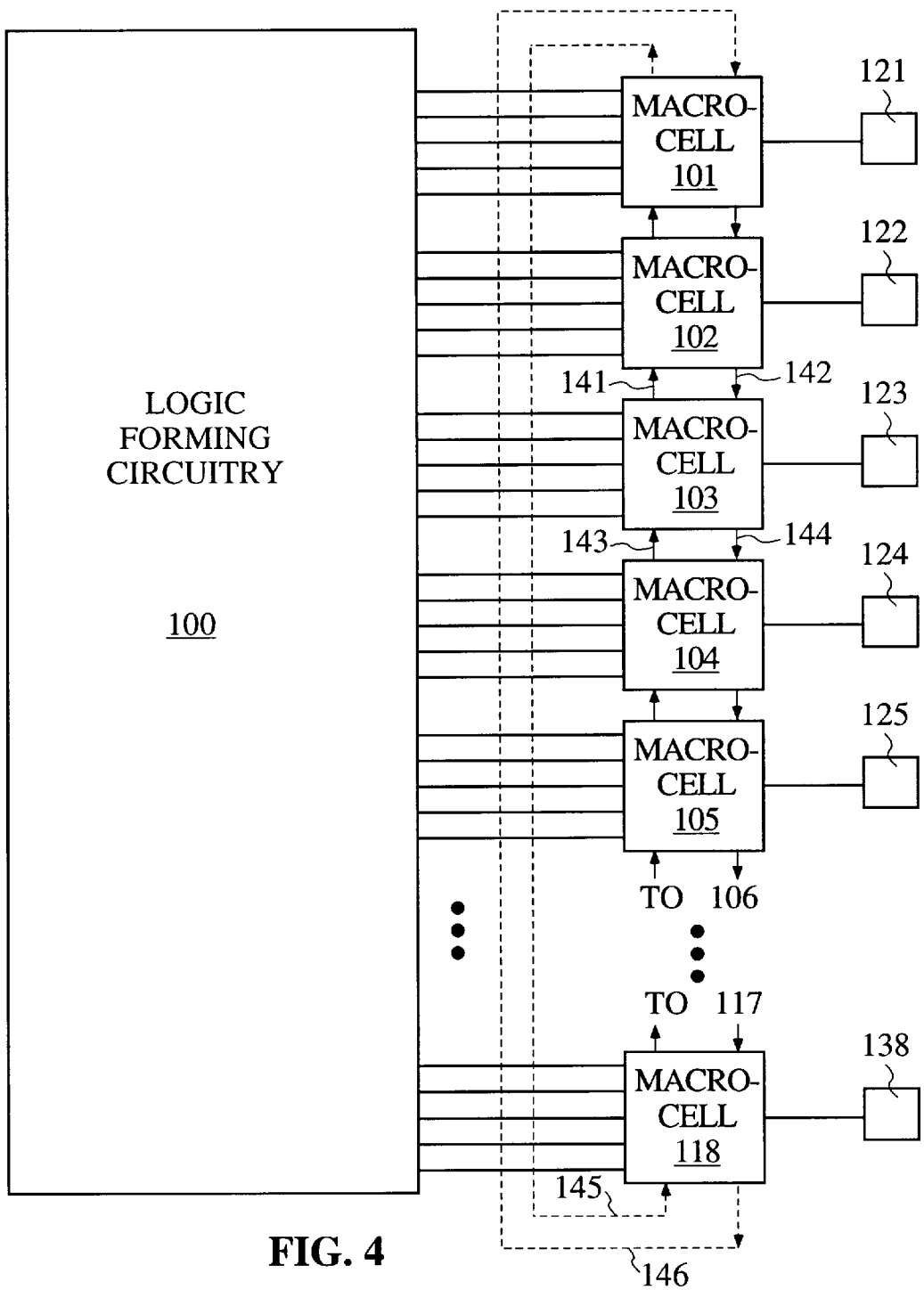
FIG. 4 is a schematic diagram of an AND array, macrocells and output terminals for use in describing the environment of one embodiment of the present invention.

FIG. 4 is a schematic diagram of logic forming circuitry 100 (which can be, for example, an AND array or a look-up table), macrocells 101–118 and output terminals 121–138 which will be modified, as described further herein, in accordance with one embodiment of the present invention. Logic forming circuitry 100 (an AND array) has 72 columns (not shown) and 90 rows (i.e., bit lines). The 90 bit lines are arranged in 18 groups, wherein each group includes 5 bit lines. Each group of 5 bit lines is provided to a corresponding one of macrocells 101–118. Each macrocell 101–118 is connected to a corresponding output terminal 121–138. Each of macrocells 102–117 is also connected to its two adjacent macrocells. For example, macrocell 103 is connected to macrocell 102 by connector lines 141 and 142 and to macrocell 104 by connector lines 143 and 144. In the embodiment illustrated, macrocells 101 and 118 are connected to macrocells 102 and 117 (not shown), respectively, thereby forming a linear chain between macrocells 101 and 118. In an alternate embodiment, illustrated by dashed lines 145 and 146, macrocells 101 and 118 are also connected, thereby forming a ring connection between macrocells 101–118. As described in more detail below, the connections between macrocells 101–118 allow product terms to be transmitted between these macrocells.

Macrocells 101–118 are described below using the terms "previous macrocell" and "subsequent macrocell." A previous macrocell is defined as any macrocell which is positioned "above" a particular macrocell in FIG. 4. Thus, macrocells 101 and 102 are previous macrocells with respect to macrocell 103. A subsequent macrocell is defined as any macrocell which is positioned "below" a particular macrocell in FIG. 4 and macrocells 104–118 are subsequent macrocells with respect to macrocell 103.

Figure 5:
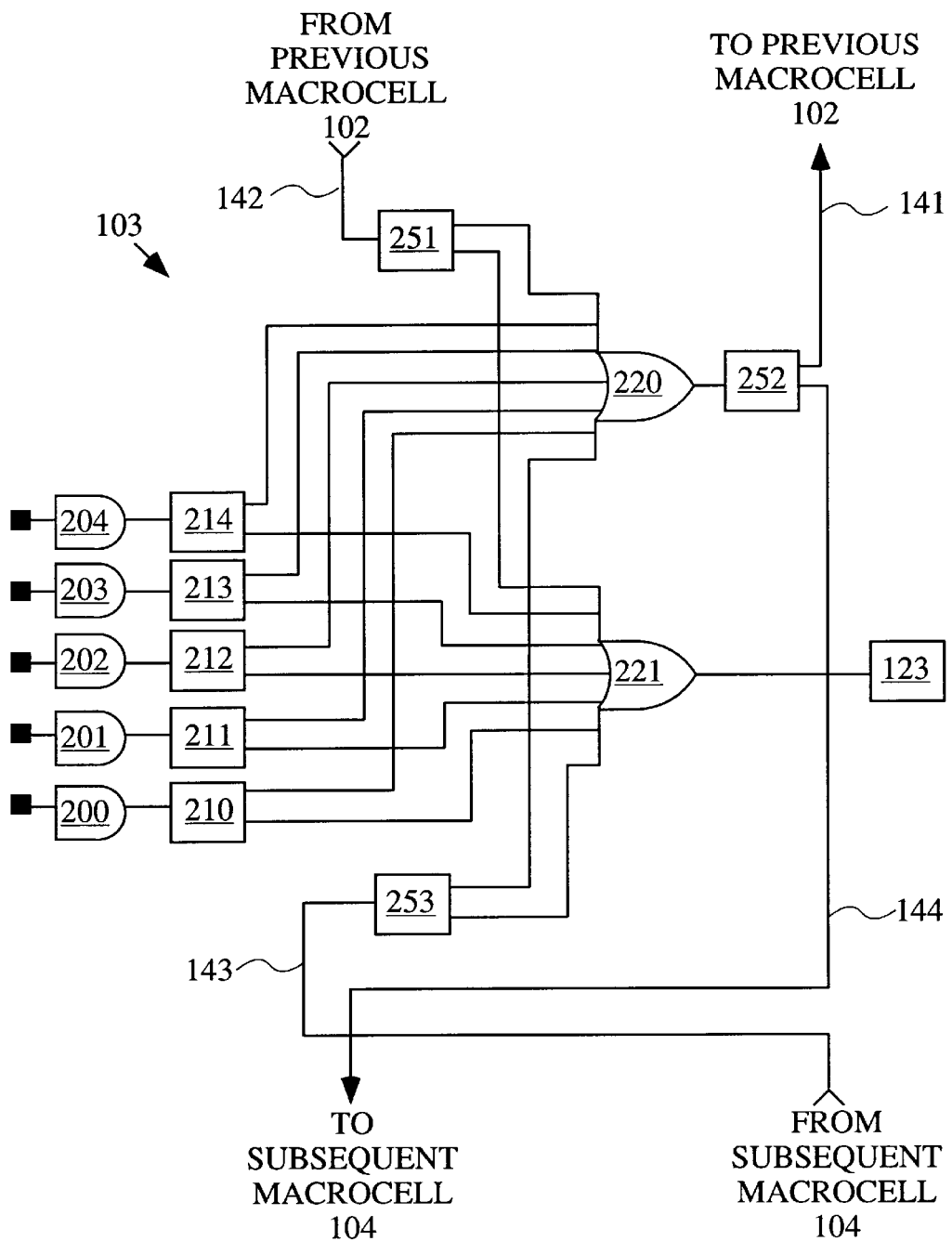
FIG. 5 is a detailed schematic diagram of one of the macrocells of FIG. 4.

FIG. 5 is a schematic diagram illustrating macrocell 103 which is to be modified, as explained further herein, in accordance with one embodiment of the invention. Macrocells 101–102 and 104–118 are identical to macrocell 103. Macrocell 103 includes AND gates 200–204, product term distribution circuits 210–214, 7-input OR gates 220 and 221, and cascade control circuits 251–253.

Product terms PT0, PT1, PT2, PT3 and PT4 are provided from logic forming circuitry 100 to sense amplifier circuits which are represented as single input AND gates 200, 201, 202, 203 and 204, respectively. As a result, product terms PT0–PT4 are routed to product term distribution circuits 210–214, respectively. Although the present invention is described in connection with product terms, it is understood that other logic signals derived from logic forming circuitry can be used in place of product terms.

Figure 6:
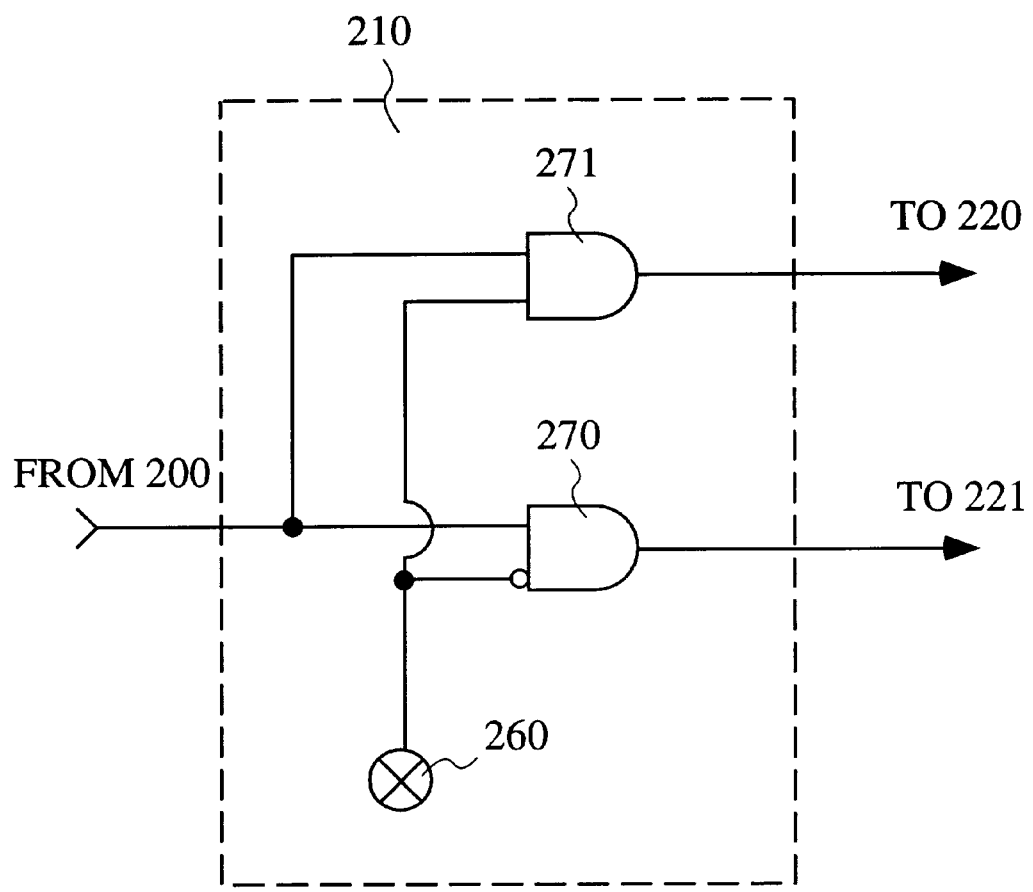
FIG. 6 is a schematic diagram of a product term distribution circuit of the macrocell of FIG. 5.

FIG. 6 is a schematic diagram illustrating product term distribution circuit 210. Product term distribution circuits 211–214 are substantially identical to product term distribution circuit 210. Product term distribution circuit 210 includes AND gates 270–271 and configurable bit latch 260. The output terminal of AND gate 200 is connected to an input terminal of each of AND gates 270 and 271, thereby providing product term PT0 to input terminals of AND gates 270 and 271. The other input terminal of AND gate 271 is connected directly to the output terminal of configurable bit latch 260. The other input terminal of AND gate 270 (which inverts the signal received) is also connected to output terminal of configurable bit latch 260. Configurable bit latch 260 is a conventional element which is programmed during initialization of the PLD to provide a logic "0" or a logic "1" value at its output terminal. The state of configurable bit latch 260 determines whether PT0 is routed to the output terminal of AND gate 270 (i.e., to export OR gate 220) or to the output terminal of AND gate 271 (i.e., to local OR gate 221). Product term distribution circuits 211–214 operate in a manner similar to product term distribution circuit 210. As a result, each of product terms PT0–PT4 is selectively routed to either export OR gate 220 or local OR gate 221.

Output terminals of product term distribution circuits 210–214 are connected to input terminals of export OR gate 220. The two additional input terminals of export OR gate 220 are connected to output terminals of cascade control circuits 251 and 253. As described in more detail below, cascade control circuit 251 receives product terms from one or more of previous macrocells 101–102 and cascade control circuit 253 receives product terms from one or more of subsequent macrocells 104–118. The output terminal of export OR gate 220 is connected to cascade control circuit 252. As described in more detail below, cascade control circuit 252 is programmed to route the product terms applied to the input terminals of export OR gate 220 to one of previous macrocells 101–102 or to one of subsequent macrocells 104–118.

Output terminals of product term distribution circuits 210–214 are also connected to input terminals of 7-input local OR gate 221. The other two input terminals of local OR gate 221 are connected to output terminals of cascade control circuits 251 and 253. As described in more detail below, cascade control circuits 251 and 253 are connected to be able to receive product terms from previous macrocells 101–102 and subsequent macrocells 104–118, respectively. The output terminal of local OR gate 221 is connected to output terminal 123.

Figure 7A:
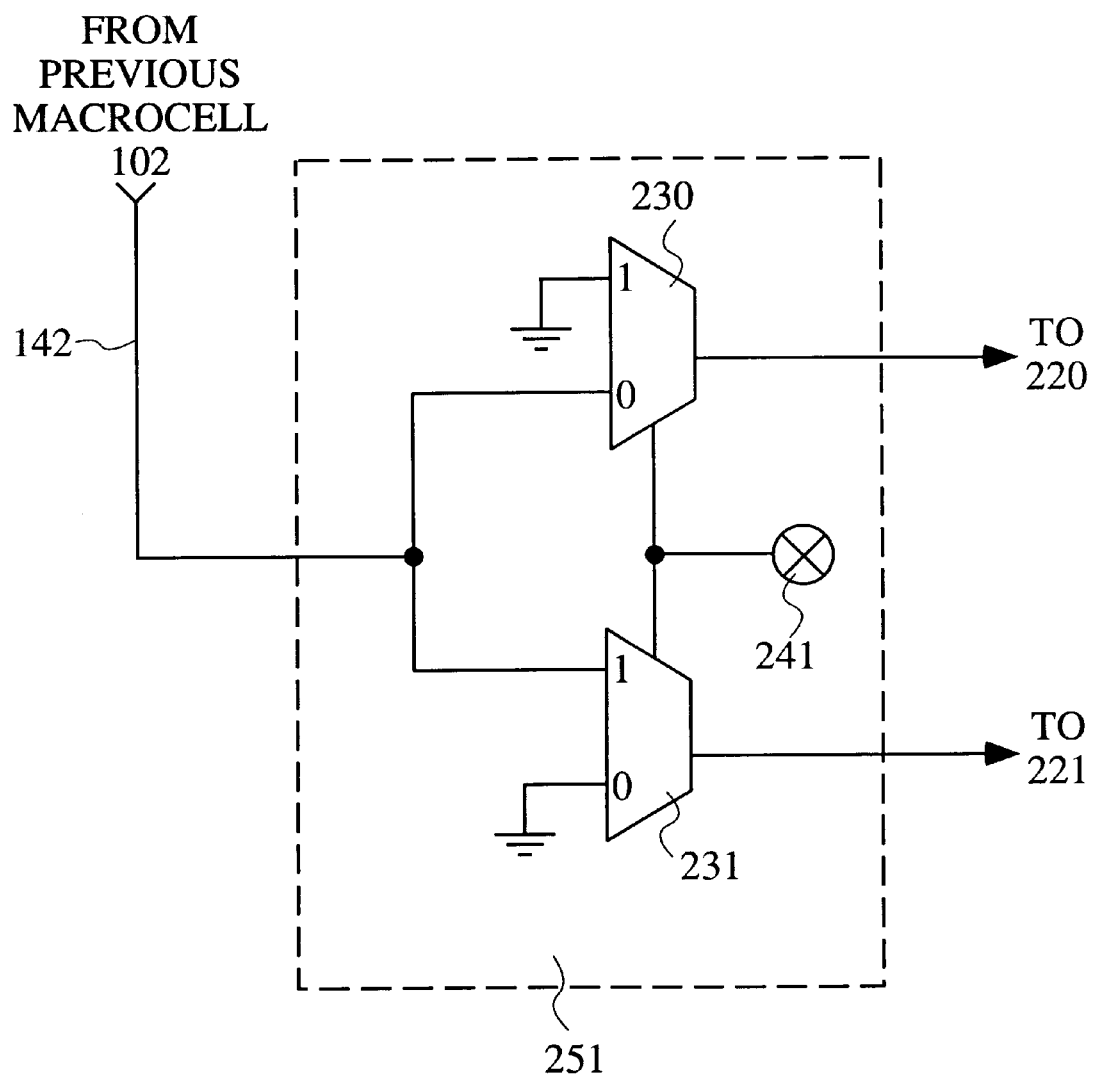
FIGS. 7a–7c are schematic diagrams of cascade control circuits of the macrocell of FIG. 5.

FIG. 7a is a schematic diagram of cascade control circuit 251. Product terms from previous macrocells 101–102 are provided to cascade control circuit 251 of macrocell 103 on connection line 142. Cascade control circuit 251 includes 2-to-1 multiplexers 230 and 231 and configurable bit latch 241. Connection line 142 is connected to the "0" input terminal of multiplexer 230 and to the "1" input terminal of multiplexer 231. The "1" input terminal of multiplexer 230 and the "0" input terminal of multiplexer 231 are each connected to ground, thereby providing a logic low value to these terminals. Configurable bit latch 241 is connected to the control terminals of multiplexers 230 and 231. Configurable bit latch 241 is programmed during initialization of the PLD to provide either a logic high or a logic low signal to the control terminals of multiplexers 230 and 231. When the configurable bit latch 241 is programmed to provide a logic low signal to multiplexers 230 and 231, the product terms received from previous macrocells 101–102 are provided to export OR gate 220 (local OR gate 221 receives a logic low signal). When the configurable bit latch 241 is programmed to provide a logic high signal to multiplexers 230 and 231, the product terms received from previous macrocells 101–102 are provided to local OR gate 221 (export OR gate 220 receives a logic low signal).

Figure 7B:
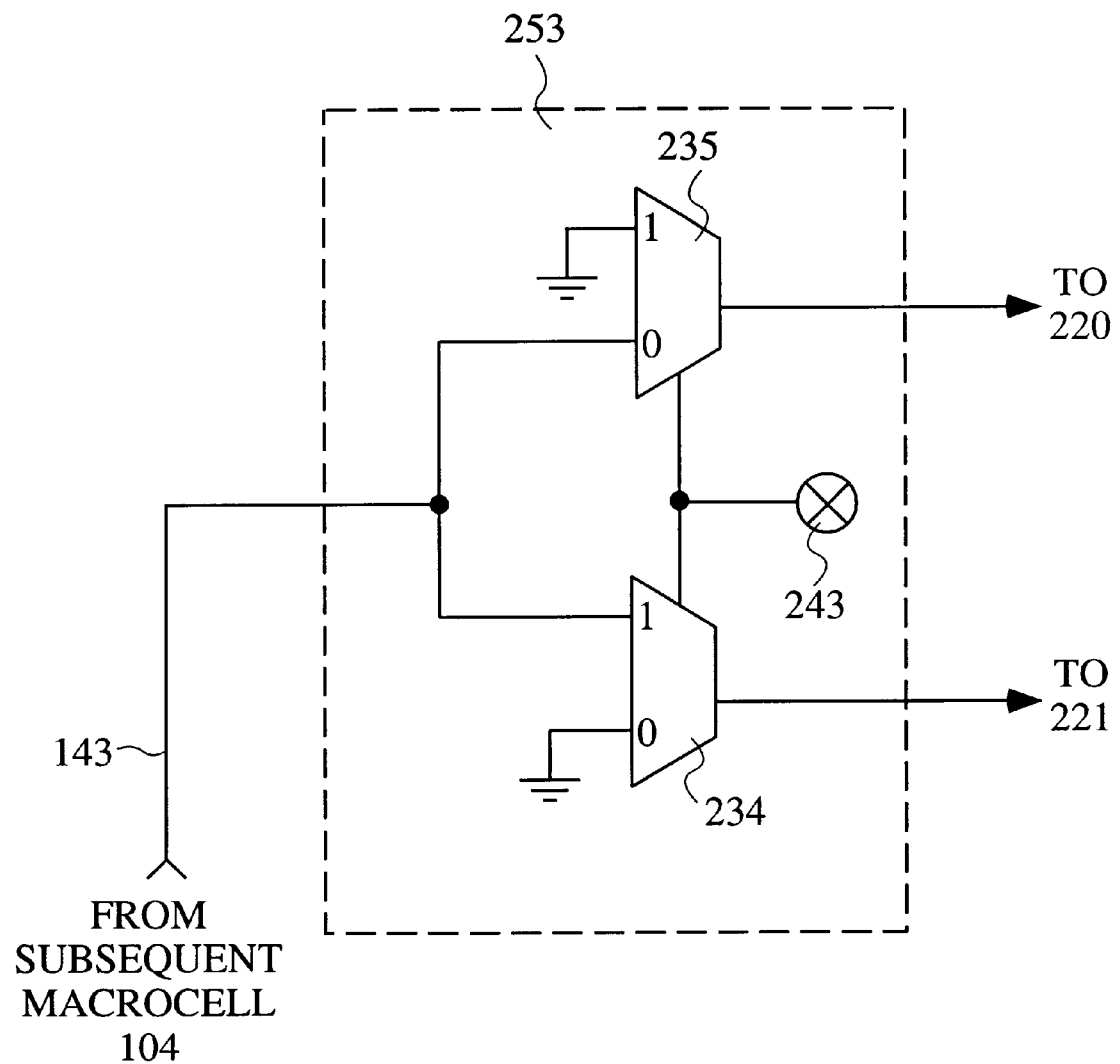

Similarly, product terms from subsequent macrocells 104–118 are provided to cascade control circuit 253 of macrocell 103 on connection line 143. FIG. 7b is a schematic diagram of cascade control circuit 253. Cascade control circuit 253 includes 2-to-1 multiplexers 234 and 235 and configurable bit latch 243. Connection line 143 is connected to the "0"input terminal of multiplexer 235 and to the "1" input terminal of multiplexer 234. The "1"input terminal of multiplexer 235 and the "0" input terminal of multiplexer 234 are connected to ground, thereby providing a logic low signal to these terminals. Configurable bit latch 243 is connected to the control terminals of multiplexers 234 and 235. Configurable bit latch 243 is programmed during initialization of the PLD to provide a logic high or a logic low signal to the control terminals of multiplexers 234 and 235. When the configurable bit latch 243 is programmed to provide a logic low signal to multiplexers 234 and 235, the product terms received from subsequent macrocells 104–118 are provided to export OR gate 220 (local OR gate 221 receives a logic low signal). When configurable bit latch 243 is programmed to provide a logic high signal to multiplexers 234 and 235, the product terms received from subsequent macrocells 104–118 are provided to local OR gate 221 (export OR gate 220 receives a logic low signal).

Figure 7C:
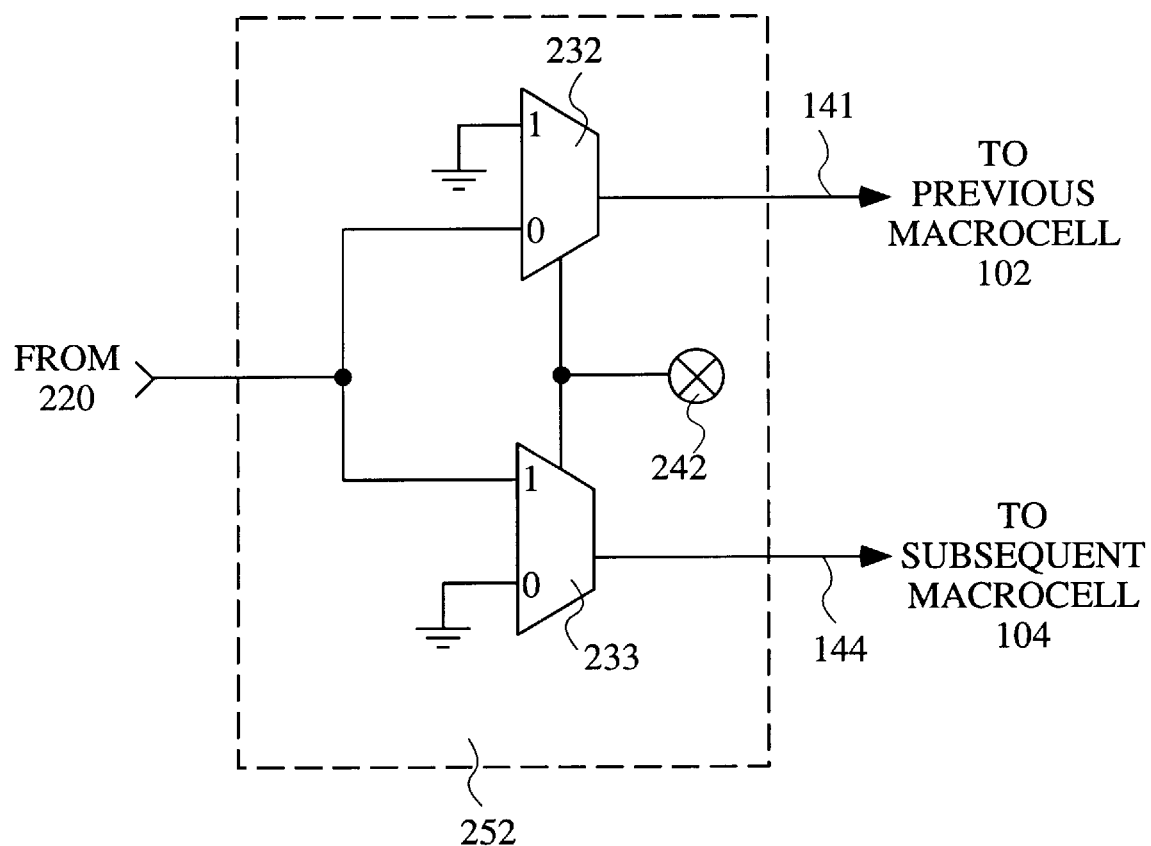

Product terms passed to the output terminal of export OR gate 220 are routed to one of previous macrocells 101–102 or to one of subsequent macrocells 104–118 through cascade control circuit 252. FIG. 7c is a schematic diagram of cascade control circuit 252. Cascade control circuit 252 includes 2-to-1 multiplexers 232 and 233 and configurable bit latch 242. The output terminal of export OR gate 220 is connected to the "0" input terminal of multiplexer 232 and to the "1" input terminal of multiplexer 233. The "1" input terminal of multiplexer 232 and the "0" input terminal of multiplexer 233 are connected to ground, thereby providing a logic low signal to these input terminals. The control terminals of multiplexers 232 and 233 are connected to configurable bit latch 242. If configurable bit latch 242 is programmed to provide a logic low signal to the control terminals of multiplexers 232 and 233, the product terms provided at the output terminal of export OR gate 220 are routed through multiplexer 232 to one of previous macrocells 101–102 on connector line 141 and a logic low signal is transmitted to subsequent macrocell 104 on connector line 144.

If configurable bit latch 242 is programmed to provide a logic high signal to the control terminals of multiplexers 232 and 233, the product terms provided at the output terminal of export OR gate 220 are routed through multiplexer 233 to one of subsequent macrocells 104–118 on connector line 144 and a logic low signal is transmitted to previous macrocell 102 on connector line 141.

Table 1 below summarizes the operation of macrocells 102–104. The reference numbers illustrated in parentheses define the operation of macrocell 103 if any of product terms PT0–PT4 are routed to export OR gate 220. If none of product terms PT0–PT4 are routed to export OR gate 220, the reference numbers shown in parentheses are ignored. For example, in the second row of Table 1, product terms are imported to macrocell 103 from macrocell 104 and exported from macrocell 103 to macrocell 102. If any of product terms PT0–PT4 are routed to export OR gate 220, these product terms will also be exported from macrocell 103 to macrocell 102. If none of product terms PT0–PT4 are routed to export OR gate 220, none of product terms PT0–PT4 are exported from macrocell 103 to macrocell 102.

TABLE 1

| Status of 241 | Status of 242 | Status of 243 | Local OR gate 221 of MC 103 imports PTs from Macrocell | PTs exported from Macrocell | PTs exported to Macrocell |
| --- | --- | --- | --- | --- | --- |
| 0 | 0 | 0 | — | 104(103) | 102 |
| 0 | 0 | 1 | 104 | –103 | –102 |
| 0 | 1 | 0 | — | 102(103) | 104 |
| 0 | 1 | 1 | 104 | 102(103) | 104 |
| 1 | 0 | 0 | 102 | 104(103) | 102 |
| 1 | 0 | 1 | 102 + 104 | 103 | –102 |
| 1 | 1 | 0 | 102 | –103 | –104 |
| 1 | 1 | 1 | 102 + 104 | –103 | –104 |

Row 1 of Table 1 describes a "pass-through backward" configuration in which product terms from subsequent macrocell 104 are routed to previous macrocell 102 through macrocell 103. Row 3 of Table 1 describes a "pass-through forward" configuration in which product terms from previous macrocell 102 are routed to subsequent macrocell 104 through macrocell 103. Macrocell 103 does not import any product terms from macrocells 102 or 104 in the "pass-through backward" or "pass through forward" configurations. The "pass through backward" and "pass through forward" configurations are useful to allow product terms to be passed through macrocell 103 without using these passed through product terms to form the output function of macrocell 103. If the output function of macrocell 103 requires less than all of its five local product terms PT0–PT4, then any of the remaining local product terms can be combined with the passed through product terms (using export OR gate 220) and routed to one of the previous or subsequent macrocells.

Row 2 of Table 1 describes a "normal import backward" configuration in which one or more product terms from subsequent macrocell 104 are routed for local use within macrocell 103, while one or more local product terms PT0–PT4 are routed to previous macrocell 102. Similarly, Row 7 of Table 1 describes a "normal import forward" configuration in which one or more product terms from previous macrocell 102 are routed for local use within macrocell 103, while one or more local product terms PT0–PT4 are routed to subsequent macrocell 104.

The "normal import backward" and "normal import forward" configurations are useful to reallocate product terms after a pinout has been committed. For example, the "normal import backward" configuration allows a number of unused product terms of subsequent macrocell 104 to be routed for use within macrocell 103, thereby freeing a corresponding number of product terms of macrocell 103 to be routed for use within previous macrocell 102.

Row 4 of Table 1 describes an "alternative import" configuration in which macrocell 103 receives additional product terms from subsequent macrocell 104. The product terms surrendered by macrocell 104 are replaced by routing product terms from previous macrocell 102 to subsequent macrocell 104. Similarly, Row 5 of Table 1 describes another "alternative import" configuration in which macrocell 103 receives additional product terms from previous macrocell 102. The product terms surrendered by macrocell 102 are replaced by routing product terms from macrocell 104 to macrocell 102. These "alternative import" configurations provide extra flexibility in the reallocation of product terms.

Rows 6 and 8 of Table 1 describe "double import" configurations, in which macrocell 103 receives product terms from both previous macrocell 102 and subsequent macrocell 104. Macrocell 103 is capable of routing one or more of local product terms PT0–PT4 to subsequent macrocell 104 (Row 8 configuration) or to previous macrocell 102 (Row 6 configuration). These "double import" configurations allow macrocell 103 to import a large number of product terms.

Macrocells 101–118 advantageously allow the routing of a variable, selectable number of product terms. Thus, any group of the five product terms PT0–PT4 are selectively routed to: (1) a previous macrocell (e.g., macrocell 101 or 102), (2) a subsequent macrocell (e.g., any one of macrocells 104–118), or (3) the output terminal of the macrocell (e.g., output terminal 123). Because product terms PT0–PT4 are routed to previous macrocells or subsequent macrocells, product terms PT0–PT4 are routed in one of two directions along the chain (or ring) formed by macrocells 101–118.

Figure 8:
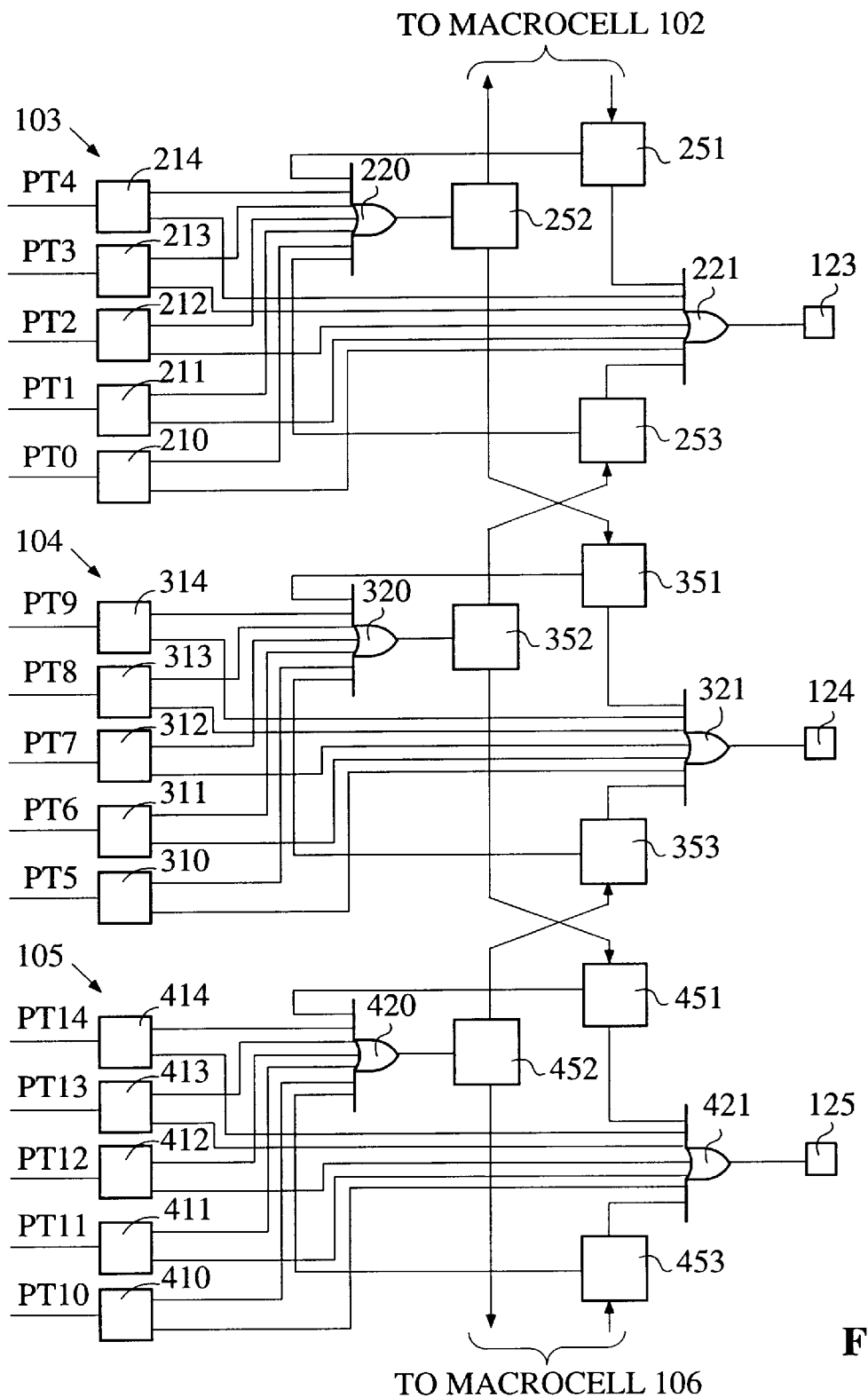
FIG. 8 is a block diagram which illustrates routing of product terms between a plurality of macrocells in accordance with one embodiment of the invention.

The configuration of macrocells 101–118 allows product terms to be routed through a plurality of macrocells to a destination macrocell. FIG. 8 is a block diagram which illustrates routing of product terms between macrocells 103, 104 and 105. Macrocells 104 and 105 each include circuitry which is substantially identical to the circuitry previously described in connection with macrocell 103. Thus, macrocell 104 includes product term distribution circuits 310–314, 7-input OR gates 320–321 and cascade control circuits 351–353, and macrocell 105 includes product term distribution circuits 410–414, 7-input OR gates 420–421, and cascade control circuits 451–453. Macrocell 104 receives product terms PT5–PT9 and macrocell 105 receives product terms PT10–PT14.

Any number of the product terms PT5–PT9 of macrocell 104 are routed to macrocell 103. For example, product terms PT8 and PT9 can be routed to macrocell 103 as follows.

(1) Product term distribution circuits 313 and 314 are programmed to transmit product terms PT8–PT9 to export OR gate 320 of macrocell 104.

(2) Cascade control circuit 352 is programmed to route product terms PT8–PT9 to cascade control circuit 253 of macrocell 103.

(3) Cascade control circuit 253 is programmed to route product terms PT8–PT9 to local OR gate 221 of macrocell 103.

Macrocell 103 selectively receives product terms from more remotely located subsequent macrocells, such as macrocell 105. For example, product terms PT10–PT13 of macrocell 105 are provided to macrocell 103 as follows.

(1) Product term distribution circuits 410–413 are programmed to transmit product terms PT10–PT13 to export OR gate 420 of macrocell 105.

(2) Cascade control circuit 452 is programmed to route product terms PT10–PT13 to cascade control circuit 353 of macrocell 104.

(3) Cascade control circuit 353 is programmed to route product terms PT10–PT13 to export OR gate 320 of macrocell 104.

(4) Cascade control circuit 352 is programmed to route product terms PT10–PT13 to cascade control circuit 253 of macrocell 103.

(5) Cascade control circuit 253 is programmed to route product terms PT10–PT13 to local OR gate 221 of macrocell 103.

Product terms from more than one subsequent (or previous) macrocell are selectively provided to a destination macrocell. For example, product terms PT8–PT9 from macrocell 104 and product terms PT10–PT13 from macrocell 105 are simultaneously provided to macrocell 103 by following all of the programming steps listed above.

Macrocells in accordance with the present invention also have the capability to export product terms at the same time that product terms are being received from another macrocell. For example, in one embodiment, macrocell 104 (FIG. 8) provides product terms PT6–PT9 to macrocell 103, uses product term PT5 locally, and receives product terms PT10–PT14 from macrocell 105 as follows.

(1) Product term distribution circuits 311–314 are programmed to transmit product terms PT6–PT9 to export OR gate 320 of macrocell 104.

(2) Cascade control circuit 352 is programmed to route product terms PT6–PT9 to cascade control circuit 253 of macrocell 103.

(3) Cascade control circuit 253 is programmed to route product terms PT6–PT9 to local OR gate 221 of macrocell 103.

(4) Cascade control circuit 310 is programmed to route product term PT5 to local OR gate 321 of macrocell 104.

(5) Cascade control circuits 410–414 are programmed to route product terms PT10–PT14 to export OR gate 420 of macrocell 105.

(6) Cascade control circuit 452 is programmed to route product terms PT10–PT14 to cascade control circuit 353 of macrocell 104.

(7) Cascade control circuit 353 is programmed to route product terms PT10–PT14 to local OR gate 321 of macrocell 104.

Although the previous examples describe the transmittal of product terms from subsequent macrocells to previous macrocells, product terms can also be transmitted from previous macrocells to subsequent macrocells by reprogramming the elements of these macrocells. Moreover, even though the previous examples only describe the transmittal of product terms using three macrocells, it is understood that in other examples, product terms are transmitted through additional macrocells. In one such example, the product terms of macrocell 118 (FIG. 4) are transmitted to macrocell 103 following the same principles previously described.

The above described capabilities of macrocells 101–118 allow flexible product term reallocation, thereby eliminating the requirement of changing a committed pin out when design changes necessitate changes in the number of product terms routed to some output pins.

There are certain drawbacks in the above-described macrocell architecture with timing and density. The first drawback involves the practical use of the cascading mechanism to map product terms in a function block. Specifically, because each macrocell contains only one OR gate to produce an exporting function, if "n" product terms are exported to a previous macrocell, the remaining (5-n) product terms cannot be delivered to a subsequent macrocell and vice versa. This design limitation complicates designing the product term mapping and sometimes leads to an inability to utilize some resources or an inability to achieve optimal timing.

Figure 9A:
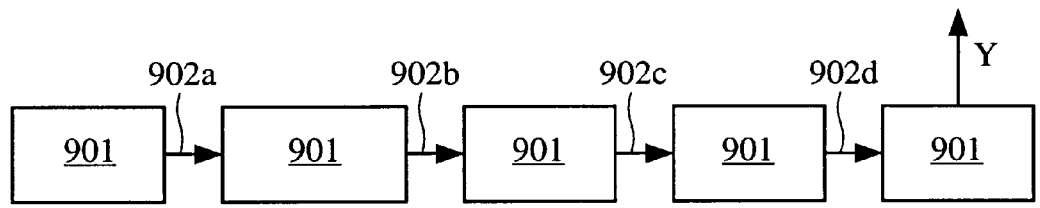
FIGS. 9a, 9b, and 10–12, inclusive, are diagrams for illustrating time delays caused by some cascading arrangements using the macrocell of FIG. 5.
Figure 9B:
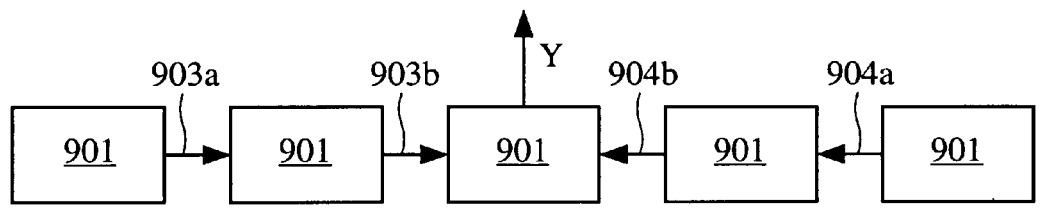

This problem becomes more severe if timing optimization is considered. Specifically, to minimize delay, product terms from both directions must be imported. For example, if an output signal Y is a sum of 25 product terms, these terms can be fit into 5 macrocells 901 (each macrocell having 5 product terms) as shown in FIGS. 9a and 9b. Note that exporting product terms incurs delays. Referring back to FIG. 5, if a product term is exported from macrocell 104 to macrocell 102, the product term passes through cascade control circuit 253, OR gate 220, and cascade control circuit 252. Thus, the mapping of the design shown in FIG. 9a has 4 exporting delays (in one embodiment approximately 4 ns) because delays 902a, 902b, 902c, and 902d are summed due to the sequential arrangement of macrocells 901. In contrast, the mapping of the design shown in FIG. 9b has only 2 delays (in this embodiment approximately 2 ns) because delays 903a/904a and 903b/904b can occur simultaneously. However, using both directions for optimal timing may adversely affect optimal density as described in reference to FIGS. 10–11.

Figure 10:
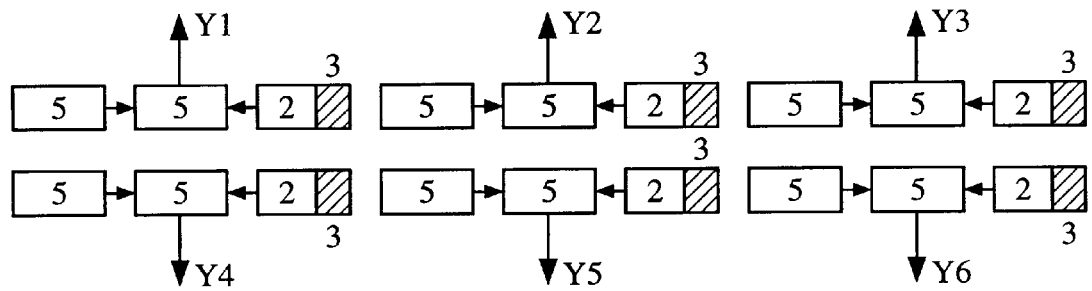

Each function block of the above-described architecture includes 18 macrocells, each macrocell receiving 5 product terms from logic forming circuitry. Assume a need to allocate 7 equations having output signals Y1–Y7, each equation having 12 product terms (total of 84 product terms). In this example, propagation delay between inputs and outputs is minimized by using both exporting directions in each macrocell. (As discussed previously, each macrocell allows selection of one of two exporting directions, but not both directions). However, with such a restriction, as shown in FIG. 10, only 6 equations having output signals Y1–Y6 are fit in a function block using both exporting directions.

Thus, even though a function block contains a total of 90 product terms, it is impossible to allocate the 84 product terms required by the design while providing optimal timing.

Figure 11:
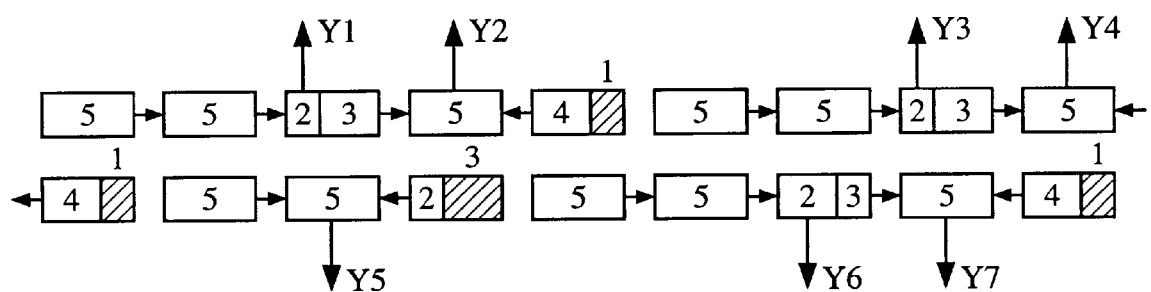

Referring to FIG. 11, all 7 equations could be fit if optimal timing for some equations is sacrificed. Specifically, the timing for the equations having output signals Y1, Y3, Y6 (unidirectional exporting providing 2 export delays) is worse than the equations having output signals Y2, Y4, Y5, Y7 (bidirectional exporting providing 1 export delay).

Figure 12:
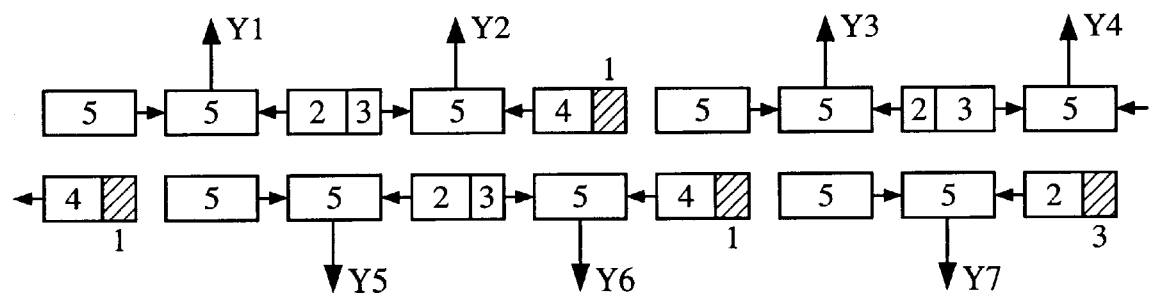
Figure 14A:
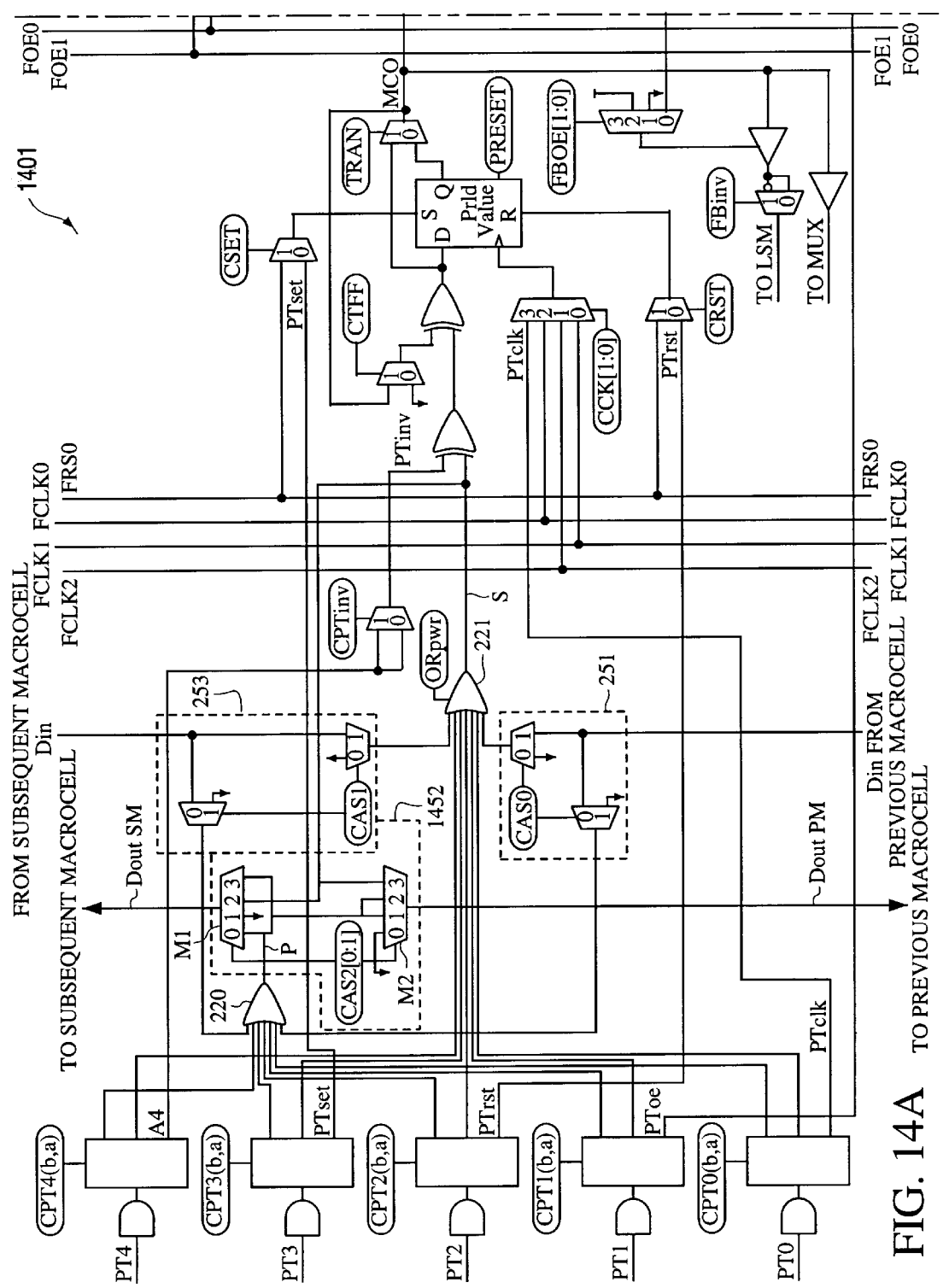

FIG. 12 illustrates how an architecture which allows each macrocell to export product terms in both directions concurrently can ensure optimal timing (1 export delay) for all equations. FIGS. 14A-B show such an architecture.

Specifically, FIGS. 14A-B show a modified macrocell 1401 according to a first embodiment of the present invention which uses OR gate 220 for the product term exporting. (Note that FIGS. 13A-B illustrate macrocell 103 (FIG. 5) in greater detail. Identical elements in FIGS. 5, 13A-B, and 14A-B have been given the same reference numbers.) To implement the new exporting scheme, the following changes were made to macrocell 103 (FIGS. 13A-B).

One more configuration bit is added to a multiplexer control CAS2 which is part of cascade control circuit 1452.

Multiplexers M1 and M2, which are also part of cascade control circuit 1452, have 4 input terminals instead of 2 input terminals.

An output signal P of local OR gate 220 is provided to 2 input terminals of both multiplexers M1 and M2. Specifically, output signal P is provided to terminals 0 and 3 of multiplexer M1 and terminals 1 and 3 of multiplexer M2.

An output signal S of local OR gate 221 is provided to terminal 2 of multiplexer M1 and terminal 3 of multiplexer M2.

As in macrocell 103, terminal 1 of multiplexer M1 and terminal 0 of multiplexer M2 are grounded.

The exporting circuit behavior of macrocell 1401 is described in Table 2.

TABLE 2

| CAS2[0:1] | DOUTSM | DOUTPM |
|---|---|---|
| 0 | P | Ground |
| 1 | Ground | P |
| 2 | S | P |
| 3 | P | S | where

DOUTSM is an output line to a Subsequent Macrocell;
DOUTPM is the output line to a Previous Macrocell;
P is the output signal of export OR gate 220; and
S is the output signal of local OR gate 221.

The product term exporting scheme in accordance with the present invention allows providing the output signal S of OR gate 221 to one of the cascade output lines DOUTSM or DOUTPM. In this manner, OR gate 220 and OR gate 221 can both be used for concurrently exporting product terms to both the subsequent and the previous macrocell, thereby allowing all product terms of the macrocell to be fully utilized if OR gate 221 is not used for the local macrocell output function. If OR gate 221 is used for the local macrocell output function, the same product terms can be used for exporting as well, thereby facilitating implementing the sharing of common product terms between two macrocell output functions.

The present invention advantageously provides minimal exporting timing and minimizes any macrocell change compared to the above-described architectures.

Figure 13:
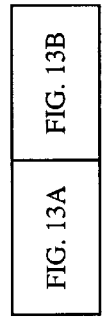
FIGS. 13A-B are a more detailed schematic diagram of the macrocell of FIG. 5.
Figure 13B:
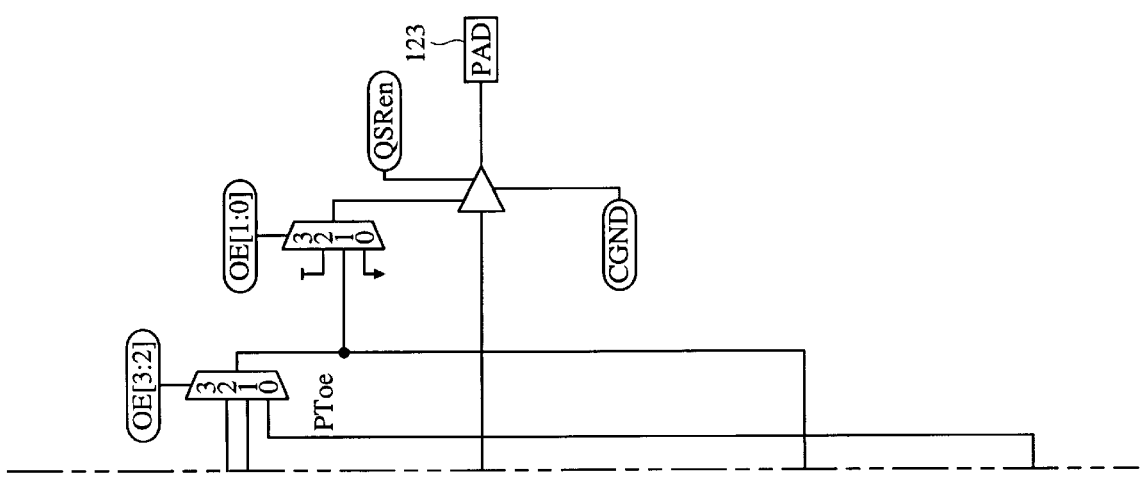
Figure 13A:
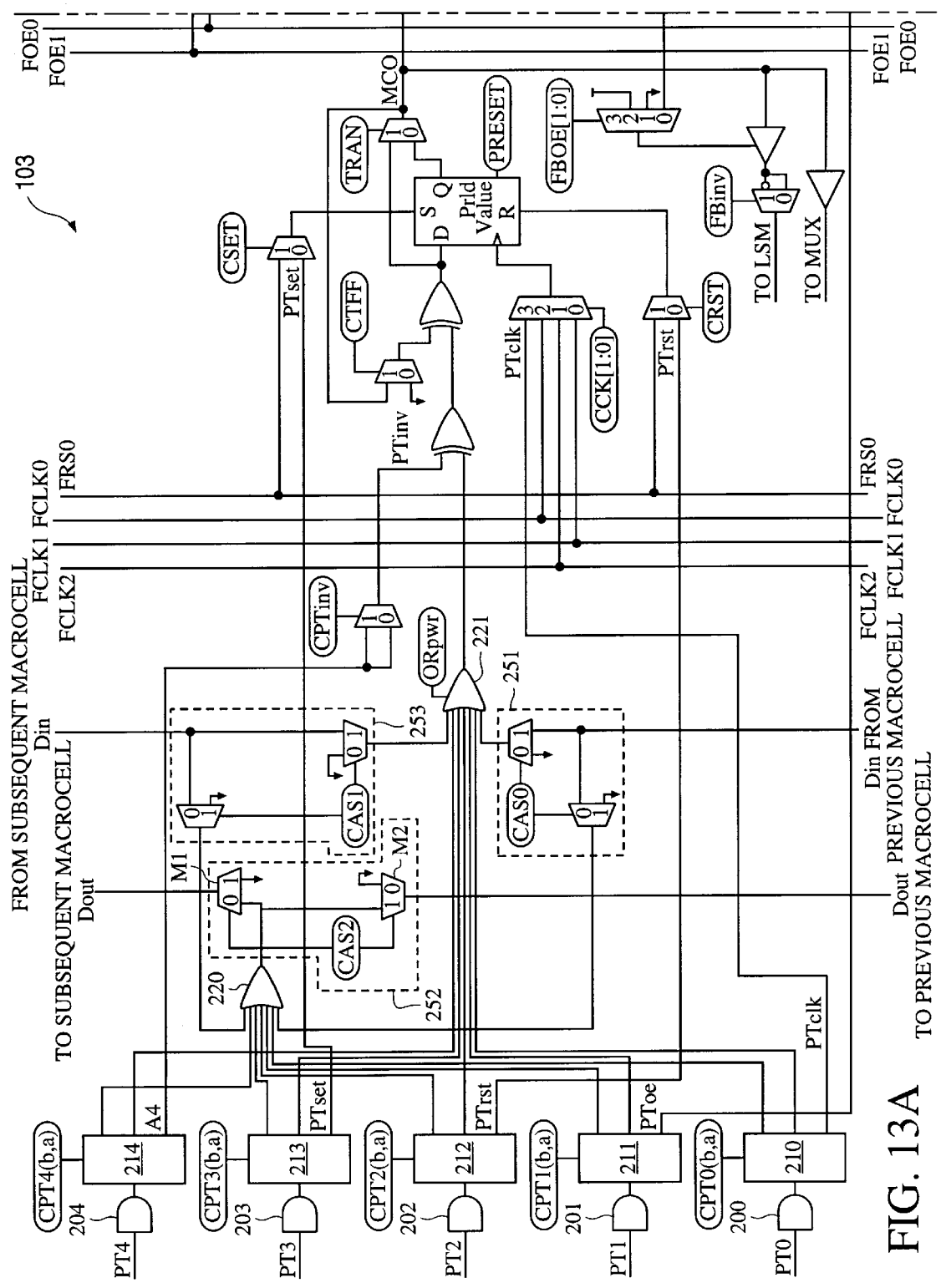
Figures 15, 15B:
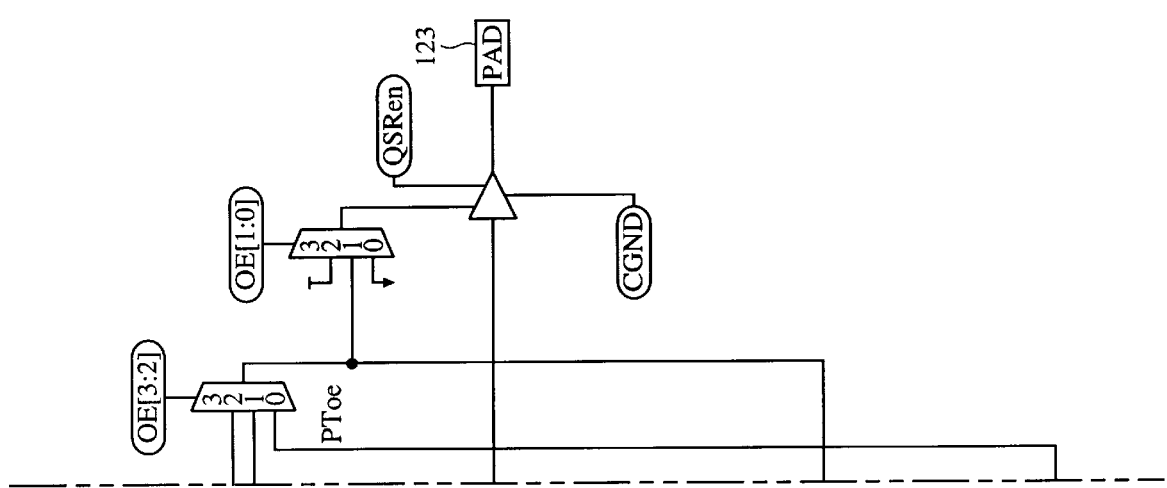
FIGS. 15A-B are a schematic diagram of a second embodiment of the improved macrocell of the present invention.
Figure 15A:
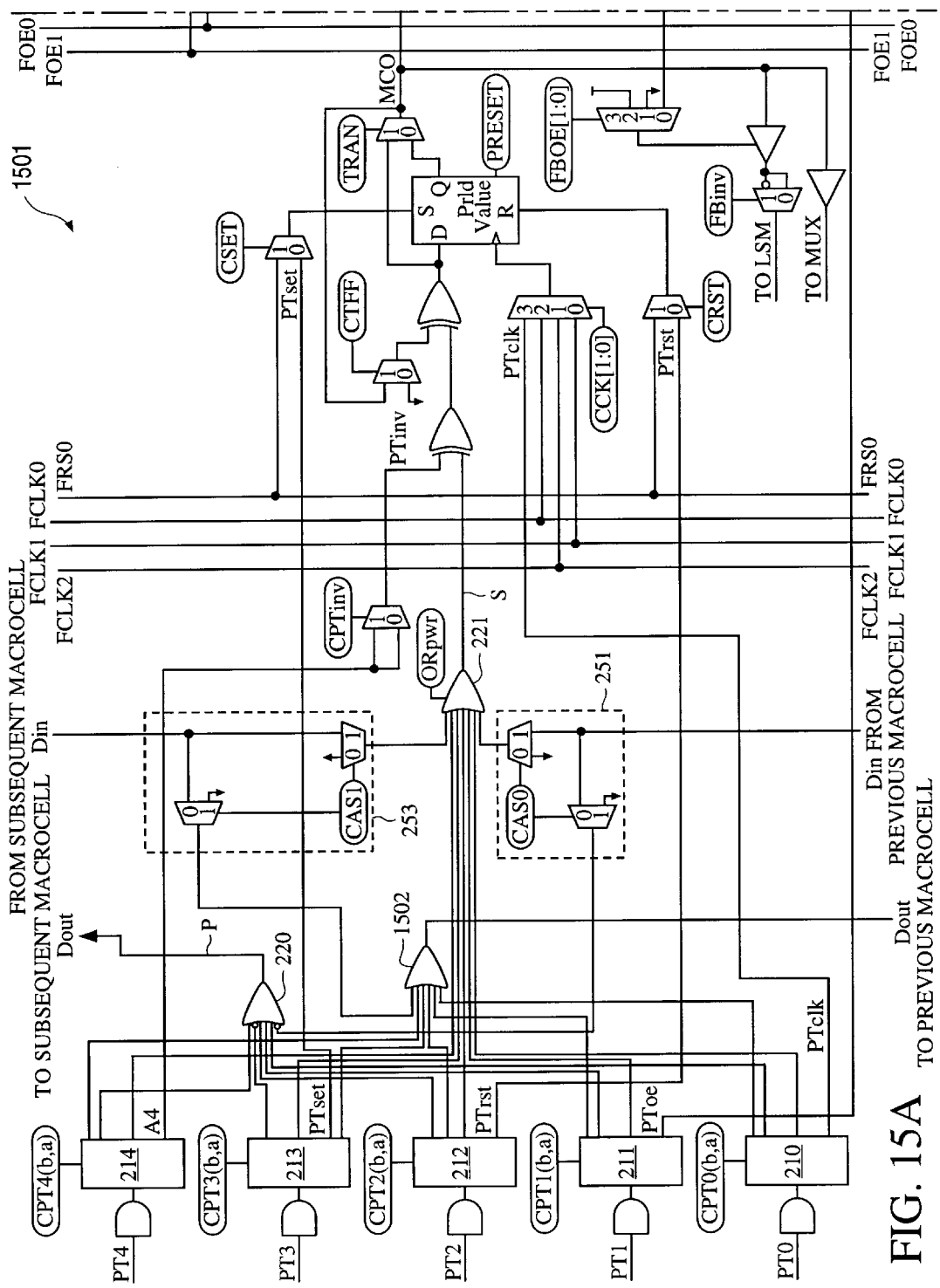

FIGS. 15A-B illustrate an alternative macrocell 1501 of the present invention in which cascade control circuit 252 of FIG. 13 is eliminated and an extra OR gate 1502 is added. In this embodiment, the output signal P is provided directly to the subsequent macrocell. Each product term distribution circuit 210–214 provides an additional configurable product term output signal which is supplied as an input signal to OR gate 1502. The output signal of OR gate 1502 is provided to the previous macrocell. The output signal S of OR gate 221 is unchanged from the embodiment of FIGS. 13A-B and passes through to the output of macrocell 1501. Note that this embodiment requires an additional wide input (or cascade) OR gate (OR gate 1502) as well as an additional line from each product term distribution circuit 210–214 and therefore sacrifices some silicon area compared to macrocell 103 (FIGS. 13A-B).

While the present invention has been described with reference to certain preferred embodiments, those skilled in the art to which the present invention pertains will now, as a result of the applicant's teachings herein, recognize that various modifications and other embodiments may be provided. By way of example, the precise structure of the cascade logic may be modified while preserving the advantages of the increased configurability and resources of the invention. These and other variations upon and modifications to the embodiment described herein are deemed to be within the scope of the invention which is to be limited only by the following claims.

We claim:

1. A first macrocell which connects between logic forming circuitry of a programmable logic device and an output terminal of the programmable logic device, the first macrocell comprising:

an export logic gate;

a first cascade control circuit connected to receive logic signals from a second macrocell, wherein the first cascade control circuit is programmable to route logic signals received from the second macrocell to the export logic gate;

a local logic gate coupled between the first cascade control circuit and the output terminal of the programmable logic device;

a second cascade control circuit connected to an output terminal of the export logic gate and an output terminal of the local logic gate, wherein the second cascade control circuit is programmable to route logic signals output by either the export logic gate or the local logic gate to a third macrocell; and a third cascade control circuit connected to receive logic signals from the third macrocell, wherein the third cascade control circuit is programmable to route logic signals received from the third macrocell to either the export logic gate or the output terminal of the programmable logic device.

2. The macrocell of claim 1, wherein the first cascade control circuit is further programmable to route the logic signals received from the second macrocell to the output terminal of the programmable logic device.

3. The macrocell of claim 1, wherein the export logic gate and the local logic gate each comprise an OR gate.

4. The macrocell of claim 1, further comprising:

one or more input lines which are connected to receive a corresponding number of logic signals from the logic forming circuitry; and one or more programmable distribution circuits, each distribution circuit connected to one of the input lines, wherein each distribution circuit is independently programmable to route a received logic signal to either the export logic gate or the local logic gate.

5. The macrocell of claim 1, wherein the local logic gate is coupled between the first cascade control circuit and the third cascade control circuit and the output terminal of the programmable logic device.

6. The macrocell of claim 5, wherein the local logic gate and the export logic gate each comprise an OR gate.

7. A macrocell which connects between logic forming circuitry of a programmable logic device and an output terminal of the programmable logic device, the macrocell comprising:

one or more input lines which receive a corresponding one or more logic signals;

a local logic gate;

an export logic gate;

one or more distribution circuits, each distribution circuit connected to a corresponding one of the input lines, wherein each distribution circuit is independently programmable to route a corresponding logic signal to either the local logic gate or the export logic gate;

a first cascade control circuit connected to both an output terminal of the export logic gate and an output of the local logic gate, wherein the first cascade control circuit is programmable to route logic signals output by the export logic gate to either a second macrocell or a third macrocell and to route logic signals output by the local logic gate to either the third macrocell or the second macrocell, respectively;

a second cascade control circuit connected to receive logic signals from the second macrocell, wherein the second cascade control circuit is programmable to route logic signals received from the second macrocell to an input of either the export logic gate or the local logic gate; and a third cascade control circuit connected to receive logic signals from the third macrocell, wherein the third cascade control circuit is programmable to route logic signals received from the third macrocell to an input of either the export logic gate or the local logic gate.

8. A method of routing logic signals from logic forming circuitry of a programmable logic device to output terminals of the programmable logic device, the method comprising the steps of:

providing a plurality of first logic signals to a first macrocell of the programmable logic device;

selecting first and second groups of the first logic signals, wherein the number of first logic signals in the first and second groups can be varied;

transmitting the first group of the first logic signals to an output terminal corresponding to the first macrocell;

transmitting either the first group of the first logic signals or the second group of the first logic signals to a second macrocell of the programmable logic device;

providing a plurality of second logic signals from a third macrocell to the first macrocell; and selectively transmitting the second logic signals to the output terminal of the first macrocell or to the second macrocell, wherein the first group of the first logic signals includes any number from zero to all of the first logic signals.

9. The method of claim 8, wherein the second macrocell is located adjacent to the first macrocell.

10. The method of claim 9 further comprising the step of transmitting a third group of logic signals from the second macrocell to the output terminal corresponding to the first macrocell, wherein the third group includes one or more logic signals provided to the second macrocell.

11. A method of routing logic signals from logic forming circuitry of a programmable logic device to output terminals of the programmable logic device, the method comprising the steps of:

providing a plurality of logic signals to a first macrocell of the programmable logic device;

selecting a first group and a second group of the logic signals, wherein the number of logic signals in the first group and second group can be varied;

transmitting the first group to an output terminal corresponding to the first macrocell; and transmitting either the first group or the second group to a second macrocell of the programmable logic device through one or more intermediate macrocells of the programmable logic device.

12. The method of claim 11, wherein the step of transmitting the second group further comprises the step of selecting a direction of transmission.

13. The method of claim 12, further comprising the steps of transmitting a third group of logic signals from a third macrocell to the second macrocell and performing one or more logic functions on said second and third groups.

14. A first macrocell which connects between logic forming circuitry of a programmable logic device and an output terminal of the programmable logic device, the first macrocell comprising:

one or more input lines which are connected to receive a corresponding number of logic signals from the logic forming circuitry;

a first cascade control circuit for receiving a plurality of logic signals and being programmable to a first state in which the received plurality of logic signals are routed to a second macrocell or a second state in which the received plurality of logic signals are routed to a third macrocell;

one or more distribution circuits, each distribution circuit coupled to one of the input lines, wherein each distribution circuit is independently programmable to a first state or a second state, wherein a distribution circuit programmed in the first state routes a first set of received logic signals to the output terminal of the programmable logic device and simultaneously to the first cascade control circuit, and wherein a distribution circuit programmed in the second state routes a second group of received logic signals only to the first cascade control circuit; and a second cascade control circuit having an input terminal coupled to a third macrocell, the second cascade control circuit being programmable to a first state in which output signals from the third macrocell are routed to the output terminal of the programmable logic device or a second state in which the output signals from the third macrocell are routed to the first cascade control circuit.

15. The macrocell of claim 14, further comprising:

a local logic gate having an input terminal connected to the one or more distribution circuits and an output terminal connected to the output terminal of the programmable logic device; and wherein the first cascade control circuit comprises:

a programmable latch having an output terminal; an export logic gate connected to the one or more distribution circuits;

a first multiplexer having a control terminal coupled to the output terminal of the programmable latch, a first input terminal and a fourth input terminal coupled to an output terminal of the export logic gate, a second input terminal coupled to a reference voltage, a third input terminal coupled to the output terminal of the local logic gate, and an output terminal coupled to the second macrocell; and a second multiplexer having a control terminal coupled to the output terminal of the programmable latch, a first input terminal coupled to the reference voltage, a second input terminal and a third input terminal coupled to the output terminal of the export logic gate, a fourth input terminal coupled to the output terminal of the local logic gate, and an output terminal coupled to the third macrocell.

16. The macrocell of claim 14, further comprising a third cascade control circuit having an input terminal connected to a second macrocell, whereby the third cascade control circuit can receive logic signals from the second macrocell, the third cascade control circuit being programmable to a first state, wherein in the first state the third cascade control circuit routes the received logic signals from the second macrocell to the output terminal of the programmable logic device or a second state in which the received logic signals from the second macrocell are routed to the first cascade control circuit.

17. A first macrocell which connects between logic forming circuitry of a programmable logic device and an output terminal of the programmable logic device, the first macrocell comprising:

a first cascade control circuit for receiving a plurality of logic signals and routing the plurality of logic signals to a second macrocell;

one or more input lines which are connected to receive a corresponding number of logic signals from the logic forming circuitry;

one or more distribution circuits, each distribution circuit coupled to one of the input lines, wherein each distribution circuit is independently programmable to a first state or a second state, wherein a distribution circuit programmed in the first state routes a first set of received logic signals to the output terminal of the programmable logic device and simultaneously to the first cascade control circuit, and wherein a distribution circuit programmed in the second state routes a second group of received logic signals only to the first cascade control circuit; and a second cascade control circuit having an input terminal coupled to a third macrocell, the second cascade control circuit being programmable to a first state in which output signals from the third macrocell are routed to the output terminal of the programmable logic device or a second state in which the output signals from the third macrocell are routed to the first cascade control circuit.

18. The macrocell of claim 17, further comprising a third cascade control circuit for receiving a plurality of logic signals and routing the plurality of logic signals to the third macrocell.

19. The macrocell of claim 17, wherein the one or more distribution circuits include a local logic gate connected to the output terminal of the programmable logic device.

* * * * *